United States Patent
Cartagena et al.

(10) Patent No.: US 8,741,167 B1
(45) Date of Patent: Jun. 3, 2014

(54) ETCHING COMPOSITION AND ITS USE IN A METHOD OF MAKING A PHOTOVOLTAIC CELL

(71) Applicant: E I du Pont de Nemours and Company, Wilmington, DE (US)

(72) Inventors: Angel R Cartagena, Apex, NC (US); Feng Gao, Hockessin, DE (US); Haixin Yang, Chapel Hill, NC (US); Lei Zhang, Hockessin, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 14/147,713

(22) Filed: Jan. 6, 2014

Related U.S. Application Data

(62) Division of application No. 12/816,659, filed on Jun. 16, 2010.

(51) Int. Cl.
*C03C 15/00* (2006.01)

(52) U.S. Cl.
USPC ............... 216/83; 216/94; 216/96; 216/99; 252/79.4

(58) Field of Classification Search
CPC ............ H01L 31/02245; H01L 31/0682; C09K 13/06; C09K 13/00; H05K 3/067
USPC .......................... 216/83, 94, 96, 99; 252/79.4
See application file for complete search history.

(56) References Cited

U.S. PATENT DOCUMENTS

| | | | | |
|---|---|---|---|---|
| 7,435,361 | B2 * | 10/2008 | Carroll et al. | 252/514 |
| 7,550,071 | B1 * | 6/2009 | Dirk et al. | 205/457 |
| 8,236,598 | B2 * | 8/2012 | Khadilkar et al. | 438/72 |
| 2002/0015826 | A1 * | 2/2002 | Desmarteau et al. | 428/195 |
| 2005/0143270 | A1 | 6/2005 | Wojtczak et al. | |
| 2010/0212735 | A1 * | 8/2010 | Wang et al. | 136/256 |
| 2011/0073164 | A1 * | 3/2011 | Solis et al. | 136/251 |
| 2012/0167968 | A1 * | 7/2012 | Lossen et al. | 136/255 |

FOREIGN PATENT DOCUMENTS

EP  2063319 A1  5/2009

OTHER PUBLICATIONS

International Search Report, US Commissioner for Patents, Alexandria, Virginia, in PCT/US2011/040424, PCT Counterpart of the Present U.S. Appl. No. 12/816,659.

\* cited by examiner

*Primary Examiner* — Binh X Tran

(57) ABSTRACT

This invention provides a method of making a photovoltaic cell. The method uses an etching composition comprising one or more onium salts selected from the group consisting of iodonium salts and sulfonium and an organic medium to etch the anti-reflection coating. Also provided is a photovoltaic cell made by this method.

8 Claims, 3 Drawing Sheets

ETCHING COMPOSITION AND ITS USE IN A METHOD OF MAKING A PHOTOVOLTAIC CELL

This application is a divisional of U.S. patent application Ser. No. 12/816,659 filed on Jun. 16, 2010, which is incorporated herein by reference.

FIELD OF THE INVENTION

This invention is directed to an etching composition for etching the anti-reflection coating (ARC) on a photovoltaic cell. It is also directed to a method for making a photovoltaic cell using the etching composition to etch the ARC and to photovoltaic cells made by the method.

TECHNICAL BACKGROUND OF THE INVENTION

A conventional photovoltaic cell structure with a p-type base has a negative electrode that is typically on the front side, i.e., sun side or illuminated side, of the cell and a positive electrode on the back side. Radiation of an appropriate wavelength falling on a p-n junction of a photovoltaic cell serves as a source of external energy to generate hole-electron pairs in that device. Because of the potential difference which exists at a p-n junction, holes and electrons move across the junction in opposite directions and thereby give rise to the flow of an electric current that is capable of delivering power to an external circuit. Most photovoltaic cells are in the form of a silicon wafer that has been metalized, i.e., provided with metal contacts that are electrically conductive.

Most electric power-generating solar cells currently used are silicon solar cells. Process flow in mass production is generally aimed at achieving maximum simplification and minimizing manufacturing costs. Electrodes in particular are made by using a method such as screen printing a metal paste and subsequent firing.

Typically, an anti-reflection coating (ARC) is formed on the front side of a solar cell. Exemplary anti-reflection coating materials useful in the methods and devices described herein include, but are not limited to: silicon nitride, silicon oxide, titanium oxide, $SiN_x$:H, hydrogenated amorphous silicon nitride, and silicon oxide/titanium oxide film. The coating can be formed by plasma enhanced chemical vapor deposition (PECVD), chemical vapor deposition (CVD), thermal CVD or other known techniques. In an embodiment in which the coating is silicon nitride, the silicon nitride film can be formed by low pressure CVD, PECVD, thermal CVD, or physical vapor deposition (PVD). In an embodiment in which the insulating film is silicon oxide, the silicon oxide film can be formed by thermal oxidation, thermal CVD, plasma CVD, or PVD.

For acceptable performance the front side electrode must make good electrical contact with the silicon cell surface adjacent to the anti-reflection coating. Two approaches have been used to accomplish this contact. One approach has been to deposit a front electrode-forming electrically conducting paste, e.g., a silver paste, onto the ARC. During firing the silver paste sinters and penetrates through the ARC and the front electrode so made is thereby able to make electrical contact with the silicon cell. Alternatively, the ARC has been etched in the portions where the electrode is to make contact with the silicon cell.

The silver paste is then deposited into those portions and fired to form the electrode. Etching has been accomplished by using lasers which is expensive and by using etching compositions such as Isishape® Solaretch® products available from Merck KGaA, Darmstadt, Germany.

There is a need for a non-corrosive etching composition that can remove selected portions of an anti-reflection coating and particularly for such a composition that is both thermal and UV curable.

SUMMARY OF THE INVENTION

This invention provides an etching composition comprising:
  a) one or more onium salts selected from the group consisting of iodonium salts and sulfonium salts; and
  b) an organic medium,
wherein the one or more onium salts are dispersed or dissolved in the organic medium.

In one embodiment the iodonium salts are diaryl iodonium salts. In another embodiment the sulfonium salts are triaryl sulfonium salts.

The etching composition can be cured either by exposure to photovoltaic cell firing conditions or by exposure to UV light.

The etching composition can be used to etch the anti-reflection coating of a photovoltaic cell and thereby provide direct physical contact for the front electrode paste, and after firing for the front side electrode, with the silicon cell surface adjacent to the anti-reflection coating. This provides good electrical contact of the front electrode with the silicon cell.

In addition, there is provided a method of making a photovoltaic cell, comprising the steps of:
  a) providing a silicon substrate with a diffusion layer on the front side of the silicon substrate and an anti-reflection coating superimposed on the surface of the diffusion layer;
  b) providing an etching composition, comprising:
    i) one or more onium salts selected from the group consisting of iodonium salts and sulfonium salts; and
    ii) an organic medium,
    wherein the one or more onium salts are dispersed or dissolved in the organic medium,
  c) depositing said etching composition onto those portions of the anti-reflection coating that are to be etched; and
  d) curing the etching composition to thereby remove the portions of the anti-reflection coating to provide exposed surface of the diffusion layer to serve as the contact for a front side electrode.

Also provided is the above method further comprising the steps of:
  e) depositing a front side electrode-forming paste onto the exposed surface of the diffusion layer; and
  f) firing the front side electrode-forming paste to form a front side electrode.

Also provided is a photovoltaic cell produced by the above process.

70: silver or silver/aluminum paste formed on back side
71: silver or silver/aluminum back electrode obtained by firing back side silver paste
500: etching composition on ARC
600: access region to n-type diffusion layer provided by etching
700: front side electrode-forming paste deposited in access region
701: front side electrode obtained by firing front side silver paste 700

Figure 2:
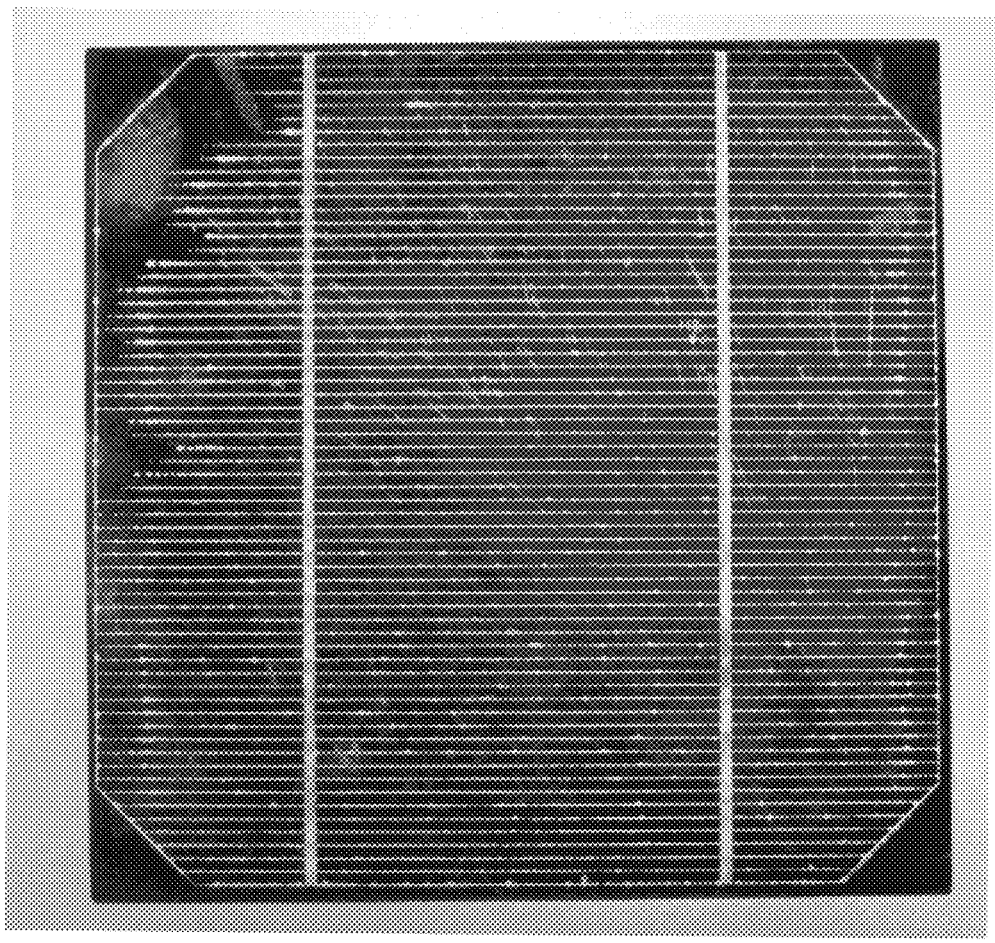

FIG. 2 shows the etched pattern provided by UV cured etching composition in Example.

DETAILED DESCRIPTION OF THE INVENTION

This invention provides an etching composition comprised of one or more onium salts dispersed or dissolved in an organic medium. The one or more onium salts are selected from the group consisting of iodonium salts and sulfonium salts. The composition is cured to activate the etching properties of the onium salts and etch the desired portions of the material to be etched, e.g., the anti-reflective coating of a photovoltaic cell. The etching can occur by thermal processing under photovoltaic firing conditions or by exposure to UV light. UV curing is especially advantageous in connection with thin film photovoltaic cells.

Onium Salts

The onium salts are selected from the group consisting of iodonium salts and sulfonium salts. In some embodiments of the composition the iodonium salts are diaryl iodonium salts with the structure I

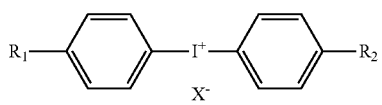

and the sulfonium salts are triaryl sulfonium salts with the structure II

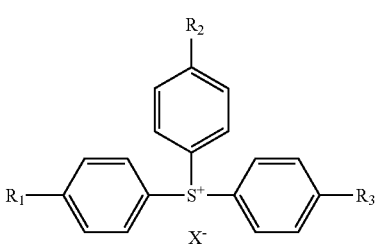

wherein, in both structures, for example, X=$SbF_6$, $PF_6$, $BPh_4$, $CF_3SO_3$, or $(CF_3SO_2)_3C$ and $R_1$, $R_2$ and $R_3$ are independently H, an alkyl group or an aryl group.

Specific, but non-limiting, examples of useful iodonium and sulfonium salts are bis(4-tert-butylphenyl)iodonium hexafluorophosphate, bis(4-tert-butylphenyl)iodonium hexafluoroantimonate, bis(4-tert-butylphenyl)iodonium triflate, bis(4-tert-butylphenyl)iodonium camphorsulfonate, bis(4-tert-butylphenyl)iodonium tosylate, [4-(octyloxy)phenyl] phenyl iodonium hexafluorophosphate, [4-(octyloxy)phenyl] phenyl iodonium hexafluoroantimonate, triphenyl sulfonium hexafluoroantimonate, triphenyl hexafluorophosphate, UVA-CURE® 1600 (phenyl-p-octyloxyphenyl-iodonium hexafluoroantimonate obtained from Cytec Industries, Smyrna, Ga.), Ciba® Irgacure® 250 (a 75% solution of iodonium, (4-methylphenyl)[4-(2 methylpropyl)phenyl]heaxafluorophosphate in propylene carbonate obtained from Ciba Specialty Chemicals, BASF) and triphenylsulfonium perfluoro-1-butane sulfonate (TPS-nf).

The onium salts are stable at typical storage temperatures. A few parts per million of a stabilizer can prevent pre-mature decomposition of onium salts The iodonium salts and sulfonium salts are not corrosive and many are TSCA (Toxic Substance Control Act) registered in the United States.

Organic Medium

The one or more onium salts are dispersed or dissolved in an organic medium by mechanical mixing to form viscous compositions called "pastes", having suitable consistency and rheology for printing. The organic medium may include a wide variety of inert viscous materials. In one embodiment, the organic medium includes carbon black powder to adjust the viscosity and thereby limit the spread of the paste. The resulting lines have better definition. The organic medium is one in which onium salts are dispersible or dissolvable with an adequate degree of stability. The rheological properties of the medium may lend good application properties to the composition, including: appropriate viscosity and thixotropy for the particular method of depositing the etching composition, e.g., screen printing, appropriate wet ability of the material to be etched and a good drying rate.

In one embodiment, the organic medium used in the etching composition of the present invention is a non-aqueous inert liquid. The use of various organic media, which may or may not contain thickeners, stabilizers and/or other common additives, is contemplated. The organic medium can be a solution of polymer(s) in solvent(s). In one embodiment, the polymer is a polymethacrylate of lower alcohols. In another embodiment, the polymer is ethyl cellulose. In addition, the organic vehicle may include volatile liquids for promoting rapid hardening after application on the substrate.

Additives

In addition to the above-described primary constituents, the etching composition of the invention may also contain various secondary materials to add to or enhance its properties such as elastomeric polymers, free radical initiators to render the composition curable either thermally or by UV light, and various printing aids such as leveling agents, antifoam agents and thickeners. These materials are well known in the art. Typically the amount of photoinitiator used is from 0.1 to 10 wt %, based on the total weight of the etching composition. Typically the amount of printing aid used is from 0.1 to 2.0 wt %, based on the total weight of the etching composition.

Method of Making a Semiconductor Device

In order to achieve good photovoltaic cell performance the front side electrode must make good electrical contact with the silicon cell. The invention provides a way of enabling this good electrical contact.

The invention provides a method of making a photovoltaic cell, comprising the steps of providing a silicon substrate with a diffusion layer on the front side of the silicon substrate and an anti-reflection coating superimposed on the diffusion layer, depositing the etching composition of the invention onto those portions of the anti-reflection coating that are to be etched, and curing the etching composition to thereby remove those portions of the anti-reflection coating to provide exposed surface of the diffusion layer to serve as the contact for a front side electrode. Also provided is the above method further comprising the steps of depositing a front side electrode-forming paste, e.g., a silver paste, onto the exposed surface of the diffusion layer and firing the front side electrode-forming paste to form the front side electrode.

The invention also provides a photovoltaic cell made by either embodiment of the method of making a photovoltaic cell described above.

An example of the method of making a photovoltaic cell is described below in conjunction with FIGS. 1A-1H.

Figure 1A:
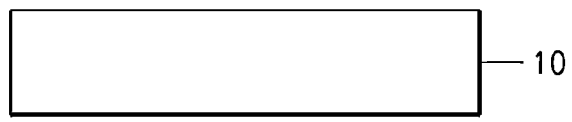
FIGS. 1A-1H show a process flow diagram illustrating the fabrication of a semiconductor device. Reference numerals shown in FIGS. 1A-1H are explained below:
  10: p-type silicon substrate
  20: n-type diffusion layer
  30: ARC, e.g., silicon nitride film, titanium oxide film, or silicon oxide film
  40: p+ layer (back surface field, BSF)
  60: aluminum paste formed on back side
  61: aluminum back electrode obtained by firing back side aluminum paste 60

FIG. 1A shows a p-type silicon substrate, 10.

Figure 1B:
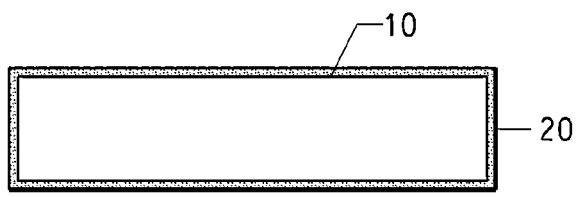

In FIG. 1B, an n-type diffusion layer, 20, (the reverse of the p-type silicon substrate) is formed by the thermal diffusion of phosphorus (P) or the like. Phosphorus oxychloride ($POCl_3$) is commonly used as the phosphorus diffusion source. In the absence of any particular modification, the diffusion layer, 20, is formed over the entire surface of the silicon substrate, 10. This diffusion layer has a sheet resistivity on the order of several tens of ohms per square ($\Omega/\mu$), and a thickness of about 0.3 to 0.5 μm.

Figure 1C:

After protecting one surface of this diffusion layer with a resist or the like, as shown in FIG. 1C the diffusion layer, 20, is removed from most surfaces by etching so that it remains only on one main surface, in this case the front side of the photovoltaic cell. The resist is then removed using an organic solvent or the like.

Figure 1D:
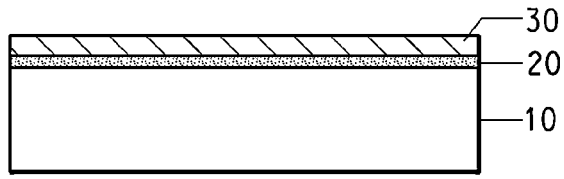

Next, a silicon nitride film, 30, is formed as an anti-reflection coating (ARC) on the n-type diffusion layer, 20, to a thickness of about 70 nm to 90 nm in the manner shown in FIG. 1D by a process such as plasma chemical vapor deposition (CVD).

Figure 1E:
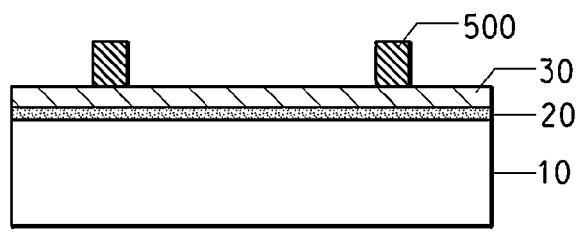

As shown in FIG. 1E, the etching composition of the invention containing a photoinitiator, 500, is screen printed onto those portions of the silicon nitride film, 30, that are to be etched. The etching composition is then dried.

Figure 1F:
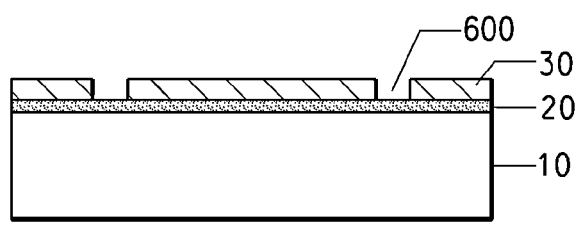

The etching composition is then cured by exposing it to UV light to thereby remove those portions of the silicon nitride film, 600, and expose the n-type diffusion layer surface as shown in FIG. 1F. Alternatively, if the etching composition were thermally cured it would be exposed to a temperature of from 300° C. to 900° C.

Figure 1G:
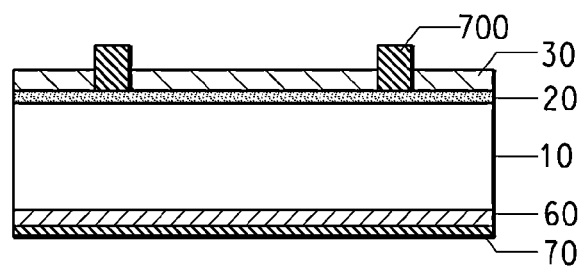

As shown in FIG. 1G, a front side electrode-forming paste, 700, is screen printed onto the exposed n-type diffusion layer surface and then dried. In addition, an aluminum paste, 60, and a back side silver or silver/aluminum paste, 70, are then screen printed and successively dried on the back side of the substrate. Firing is then typically carried out in an infrared furnace at a temperature range of approximately 700° C. to 975° C. for a period of from several minutes to several tens of minutes.

Figure 1H:
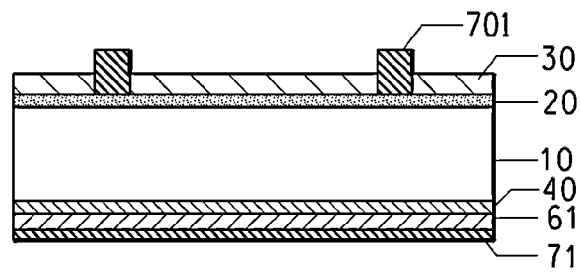

Consequently, as shown in FIG. 1H, aluminum diffuses from the aluminum paste into the silicon substrate, 10, as a dopant during firing, forming a p+ layer, 40, containing a high concentration of aluminum dopant. This layer is generally called the back surface field (BSF) layer, and helps to improve the energy conversion efficiency of the solar cell.

The aluminum paste is transformed by firing from a dried state, 60, to an aluminum back electrode, 61. The back side silver or silver/aluminum paste, 70, is fired at the same time, becoming a silver or silver/aluminum back electrode, 71. During firing, the boundary between the back side aluminum electrode and the back side silver or silver/aluminum electrode assumes an alloy state, and is connected electrically as well. The aluminum electrode accounts for most areas of the back electrode, owing in part to the need to form a p+ layer, 40. Because soldering to an aluminum electrode is impossible, a silver back electrode is formed over portions of the back side as an electrode for interconnecting solar cells by means of copper ribbon or the like.

In addition, during firing, the front side electrode-forming paste, 700, is transformed to the front side electrode, 701, as also shown in FIG. 1H. The front side electrode is thereby able to make electrical contact with the n-type diffusion layer, 20. Conversion efficiency and moisture resistance reliability of the solar cell depend on the electrical contact of the front side electrode with the n-type diffusion layer. It is believed that the improvement in solar cell performance obtained by using the onium salts in the instant etching composition is a result of the good electrical contact that is achieved.

Exemplary semiconductor substrates useful in the methods and devices described herein include, but are not limited to, single-crystal silicon, multicrystalline silicon, and ribbon silicon. The semiconductor substrate may be doped with phosphorus and boron to form a p/n junction.

The semiconductor substrates can vary in size (length× width) and thickness. As an example, the thickness of the semiconductor substrate is 50 to 500 μm; 100 to 300 μm; or 140 to 200 μm. The length and width of the semiconductor substrate are each 100 to 250 mm; 125 to 200 mm; or 125 to 156 mm.

Typically, as discussed previously, an anti-reflection coating is formed on the front side of a solar cell. Exemplary anti-refection coating materials useful in the methods and devices described herein include, but are not limited to: silicon nitride, silicon oxide, titanium oxide, $SiN_x$:H, hydrogenated amorphous silicon nitride, and silicon oxide/titanium oxide film. The coating can be formed by plasma enhanced chemical vapor deposition (PECVD), chemical vapor deposition (CVD), thermal CVD or other known techniques. In an embodiment in which the coating is silicon nitride, the silicon nitride film can be formed by low pressure CVD, PECVD, thermal CVD, or physical vapor deposition (PVD). In an embodiment in which the insulating film is silicon oxide, the silicon oxide film can be formed by thermal oxidation, thermal CVD, plasma CVD, or PVD.

The etching composition can be applied to the ARC by a variety of methods such as screen-printing, ink-jet printing, coextrusion, syringe dispensing, direct writing, and aerosol ink jet printing.

The front side electrode-forming paste can be applied to the exposed n-type diffusion layer surface by a variety of methods such as screen-printing, ink-jet printing, coextrusion, syringe dispensing, direct writing, and aerosol ink jet printing. In one embodiment, the paste composition is used to form both the conductive fingers and busbars of the front-side electrode. In such an embodiment, the width of the lines of the conductive fingers are 20 to 200 μm.

The front side electrode-forming paste coated on the exposed n-type diffusion layer surface can be dried, for example, for 0.5 to 10 minutes during which time the volatile portions of the organic medium are removed.

The dried front side electrode-forming paste is fired by heating to a maximum temperature of between 500° C. and 940° C. for a duration of 1 second to 2 minutes. In one embodiment, the maximum silicon wafer temperature reached during firing ranges from 650° C. to 800° C. for a duration of 1 to 10 seconds. In a further embodiment, the electrode formed from the front side electrode-forming paste is fired in an atmosphere composed of a mixed gas of oxygen and nitrogen. In another embodiment, the electrode formed from the front side electrode-forming paste is fired above the organic medium removal temperature in an inert atmosphere not containing oxygen. Typically, the firing is carried out in a belt furnace. The temperature range during which time the remaining organic medium is removed is between 500° C. and 700° C. and the temperature is then increased to between 860° C. and 940° C. The fired electrode can include components and compositions resulting from the firing and sintering process. For example, in an embodiment in which ZnO is a component in the paste composition, the fired electrode can include zinc-silicates, such as willemite ($Zn_2SiO_4$) and $Zn_{1.7}SiO_{4-x}$ wherein x is 0-1.

As previously suggested, other conductive and device enhancing materials are applied to the back side of the semiconductor device and cofired with the front side electrode-forming paste. The materials serve as electrical contacts, passivating layers, and solderable tabbing areas. Alternatively, these materials can be applied and fired prior to or subsequent to the firing of the front side electrode-forming paste.

In one embodiment, the back side conductive material contains aluminum or aluminum and silver.

EXAMPLES

In the following Examples the photovoltaic wafers used were 156 mm×156 mm 65Ω/☐ multicrystalline silicon wafers (obtained from Q-Cells SE, Bitterfeld-Wolfen, Germany) or portions of these wafers. These wafers contained a silicon nitride anti-reflection coating on the front side.

Example 1

This Example demonstrates the effectiveness of an onium salt in etching an anti-reflection coating.

Irgacure® 250 solution (a 75% solution of iodonium, (4-methylphenyl)[4-(2 methylpropyl)phenyl]heaxafluorophosphate in propylene carbonate obtained from Ciba Specialty Chemicals, BASF) was used with a dropping pipette to draw a letter "P" onto a 2.5 cm×2.5 cm size photovoltaic wafer. The wafer was dried at 80° C. for 10 minutes. The letter "P" had the blue color of the underlying silicon nitride anti-reflection coating. The wafer was then fired in a Despatch 6-zone belt furnace with the zone temperatures of 500-550-610-700-880-900° C. and a belt speed of 220 ipm. The blue color of the letter "P" changed to the gray color of the silicon thereby indicating that the anti-reflection coating had been etched away and the silicon exposed.

Example 2

This Example demonstrates the effectiveness of an onium salt in etching an anti-reflection coating.

8 gm of UVACURE® 1600 (phenyl-p-octyloxyphenyl-iodonium hexafluoroantimonate obtained from Cytec Industries, Smyrna, Ga.), was mixed with 2 gm isopropyl alcohol obtained from VWR, Bridgeport, N.J. and 0.2 gm of a PMMA/PMAA (poly(methyl methacrylate)/polymethacrylic acid) copolymer solution in Texanol® ester alcohol obtained from Eastman Chemical Company, Kingsport, Tenn. The polymer solution contained 42.5 wt % PMMA with a Mw=6700 and 20 wt % PMAA. The mixture was hand-stirred for 5 minutes. The mixture was used with a dropping pipette to draw a letter "V" onto a 2.5 cm×2.5 cm size photovoltaic wafer. The wafer was dried at 80° C. for 10 minutes. The letter "V" had the blue color of the underlying silicon nitride anti-reflection coating. The wafer was then fired in a Despatch 6-zone belt furnace with the zone temperatures of 500-550-610-700-880-900° C. and a belt speed of 220 ipm. The blue color of the letter "V" changed to the gray color of the silicon thereby indicating that the anti-reflection coating had been etched away and the silicon exposed.

Example 3

This Example demonstrates the effectiveness of an onium salt in etching an anti-reflection coating.

0.25 gm of UVACURE® 1600 (phenyl-p-octyloxyphenyl-iodonium hexafluoroantimonate obtained from Cytec Industries, Smyrna, Ga.), was mixed with 20 gm isopropyl alcohol obtained from VWR, Bridgeport, N.J. The mixture was hand-stirred for 2 minutes. The mixture was used with a dropping pipette to draw a letter "X" onto a 2.5 cm×2.5 cm size photovoltaic wafer. The wafer was dried at 80° C. for 10 minutes. The letter "X" had the blue color of the underlying silicon nitride anti-reflection coating. The wafer was then fired in a box oven at 350° C. for 1 hour. The blue color of the letter "X" changed to the gray color of the silicon thereby indicating that the anti-reflection coating had been etched away and the silicon exposed.

Example 4

This Example demonstrates the effectiveness of an onium salt in etching an anti-reflection coating.

Irgacure® 250 solution (a 75% solution of iodonium, (4-methylphenyl)[4-(2 methylpropyl)phenyl]heaxafluorophosphate in propylene carbonate obtained from Ciba Specialty Chemicals, BASF) was screen-printed onto a 156 mm×156 mm silicon wafer with the pattern shown in FIG. 3. The wafer was dried at 80° C. for 10 minutes. The screen-printed pattern had the blue color of the underlying silicon nitride anti-reflection coating. The wafer was then fired in a Despatch 6-zone belt furnace with the zone temperatures of 500-550-610-700-880-900° C. and a belt speed of 220 ipm. The blue color of the screen-printed pattern changed to the gray color of the silicon thereby indicating that the anti-reflection coating had been etched away and the silicon exposed.

The sample was analyzed by electron spectroscopy for chemical analysis (ESCA). The patterned spots showed little or no nitrogen indicating that the silicon nitride ARC was almost completely or completely removed.

Example 5

This Example demonstrates the effectiveness of an onium salt in an etching composition for etching an anti-reflection coating and the use of thermal curing.

20 gm ethyl cellulose N-22, 80 gm Texanol® ester alcohol obtained from Eastman Chemical Company, Kingsport, Tenn. and 0.5 gm Thixatrol®ST obtained from Elementis Specialties, Inc., Highstown, N.J. were mixed and the mixture was stirred by a mechanical stirrer at 100° C. for 1.5 hours. The result was a clear viscous solution. The solution was cooled to 60° C. and 10 gm of UVACURE® 1600 (phenyl-p-octyloxyphenyl-iodonium hexafluoroantimonate obtained from Cytec Industries, Smyrna, Ga.) was added and stirred for 20 minutes.

The above solution was screen-printed onto a 156 mm×156 mm silicon wafer with the pattern shown in FIG. 3. The wafer was dried at 80° C. for 10 minutes. The screen-printed pattern had the blue color of the underlying silicon nitride anti-reflection coating. The wafer was then fired in a Despatch 6-zone belt furnace with the zone temperatures of 500-550-610-700-880-900° C. and a belt speed of 220 ipm. The blue color of the screen-printed pattern changed to the gray color of the silicon thereby indicating that the anti-reflection coating had been etched away and the silicon exposed.

Example 6

This Example demonstrates the effectiveness of an onium salt in etching an anti-reflection coating and the use of UV curing.

To 10 gm of Irgacure® 250 solution (a 75% solution of iodonium, (4-methylphenyl)[4-(2 methylpropyl)phenyl]heaxafluorophosphate in propylene carbonate obtained from Ciba Specialty Chemicals, BASF) there was added 0.5 gm of photoinitiator benzophenone. The mixture was stirred at room temperature by a magnetic stirrer bar for 10 minutes. The mixture was screen-printed onto a 156 mm×156 mm silicon wafer with the pattern shown in FIG. 3. The wafer was dried at 150° C. for 10 minutes. The screen-printed pattern had the blue color of the underlying silicon nitride anti-reflection coating.

The wafer was then exposed to UV light at a dose of 600 mJ/cm$^2$. After exposure the wafer was baked at 150° C. for 10 minutes. The cell was placed in cold water for 1 hour. The printed mixture was then peeled from the wafer leaving the printed pattern in the gray color of the silicon thereby indicating that the anti-reflection coating had been etched away and the silicon exposed.

Example 7

This Example demonstrates the effectiveness of an onium salt in an etching composition for etching an anti-reflection coating, the use of thermal curing and the advantage of including carbon black powder in the etching composition.

Two grams carbon black powder obtained from Cabot, Boston, Mass., 3 grams Irgacure® 250 solution (a 75% solution of iodonium, (4-methylphenyl)[4-(2 methylpropyl)phenyl]heaxafluorophosphate in propylene carbonate obtained from Ciba Specialty Chemicals, BASF) and 5 grams Texanol® ester alcohol obtained from Eastman Chemical Company, Kingsport, Tenn. were mixed. The resulting paste was used to draw 3 lines on a wafer and these were dried at 80° C. for 10 minute and then fired in Despatch 6-zone belt furnace with the zone temperatures of 500-550-610-700-850-880° C. at a belt speed of 220 ipm. The 3 changed from black color to gray color of the silicon thereby indicating that the anti-reflection coating had been etched away and the silicon exposed. The resulting lines have a better edge definition as a result of the use of the carbon black powder in the etching composition.

What is claimed is:

1. A method of making a photovoltaic cell, comprising the steps of:
    a) providing a silicon substrate with a diffusion layer on the front side of said silicon substrate and an anti-reflection coating superimposed on the surface of said diffusion layer;
    b) providing an etching composition, comprising:
        i) one or more onium salts selected from the group consisting of iodonium salts and sulfonium salts; and
        ii) an organic medium,
        wherein said one or more onium salts are dispersed or dissolved in said organic medium;
    c) depositing said etching composition onto those portions of said anti-reflection coating that are to be etched; and
    d) curing said etching composition to thereby remove said portions of said anti-reflection coating to provide exposed surface of said diffusion layer to serve as the contact for a front side electrode.

2. The method of claim 1, wherein said iodonium salts are diaryl iodonium salts and said sulfonium salts are triaryl sulfonium salts.

3. The method of claim 2, said etching composition further comprising a photoinitiator whereby said etching composition is UV curable and wherein said curing is accomplished by exposing said etching composition to UV light.

4. The method of claim 2, wherein said curing is accomplished by exposing said etching composition to a temperature of from 300° C. to 900° C.

5. The method of claim 1, further comprising the steps of:
    e) depositing a front side electrode-forming paste onto said exposed surface of said diffusion layer; and
    f) firing said front side electrode-forming paste to form said front side electrode.

6. The method of claim 5, wherein said iodonium salts are diaryl iodonium salts and said sulfonium salts are triaryl sulfonium salts.

7. The method of claim 6, said etching composition further comprising a photoinitiator whereby said etching composition is UV curable and wherein said curing is accomplished by exposing said etching composition to UV light.

8. The method of claim 6, wherein said curing is accomplished by exposing said etching composition to a temperature of from 300° C. to 900° C.

* * * * *